United States Patent
Yang et al.

(10) Patent No.: US 9,502,600 B2
(45) Date of Patent: Nov. 22, 2016

(54) INORGANIC SOLUTION AND SOLUTION PROCESS FOR ELECTRONIC AND ELECTRO-OPTIC DEVICES

(75) Inventors: Yang Yang, Los Angeles, CA (US); Wenbing Yang, Los Angeles, CA (US); Shenghan Li, San Jose, CA (US); Wan-Ching Hsu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 150 days.

(21) Appl. No.: 14/126,327

(22) PCT Filed: Jun. 18, 2012

(86) PCT No.: PCT/US2012/042989
§ 371 (c)(1),
(2), (4) Date: Dec. 13, 2013

(87) PCT Pub. No.: WO2012/174551
PCT Pub. Date: Dec. 20, 2012

(65) Prior Publication Data
US 2014/0116512 A1 May 1, 2014

Related U.S. Application Data

(60) Provisional application No. 61/498,295, filed on Jun. 17, 2011.

(51) Int. Cl.
*H01B 1/02* (2006.01)
*H01L 31/032* (2006.01)
*H01L 31/18* (2006.01)
*H01B 1/22* (2006.01)
*H01L 21/02* (2006.01)
*C23C 18/12* (2006.01)

(52) U.S. Cl.
CPC ........... *H01L 31/18* (2013.01); *C23C 18/1204* (2013.01); *H01B 1/02* (2013.01); *H01B 1/22* (2013.01); *H01L 21/0256* (2013.01); *H01L 21/02557* (2013.01); *H01L 21/02568* (2013.01); *H01L 21/02628* (2013.01); *H01L 31/0326* (2013.01); *Y02E 10/50* (2013.01)

(58) Field of Classification Search
CPC ........ H01B 1/02; H01B 1/22; H01L 31/0326
USPC ............ 252/513, 519.4, 519.5, 520.1, 521.1, 252/521.2
See application file for complete search history.

(56) References Cited

U.S. PATENT DOCUMENTS

2005/0002853 A1* 1/2005 Hubacek .................. C01G 9/00
423/566.1
2005/0158909 A1 7/2005 Milliron et al.
2006/0083850 A1* 4/2006 Valverde ................. C23C 18/34
427/58
2011/0094557 A1 4/2011 Mitzi et al.
2011/0097496 A1 4/2011 Mitzi et al.
2014/0096826 A1* 4/2014 Todorov .................... C08K 3/02
136/264

FOREIGN PATENT DOCUMENTS

WO WO-2011/051012 A1 5/2011

OTHER PUBLICATIONS

Altosaar et al., Phys. Status Solidi A, 205 167, (2008).
Contreras et al., Prog. Photovolt: Res. Appl. 13 209-216 (2005).
Dale et al., Photovoltaic Specialists Conference, pp. 2080-2085, 2009.
Hou et al., Thin Solid Films, 517 68536856, 2009.
Jesiha et al., Journal of Solid State Chemistry, 177 4482-4493(2004).
Katagiri et al., Thin Solid Films, 517 (2009) 2455-2460.
Milliron et al., Chem. Mater. 18 587-590 (2006).
Mitzi et al., Adv. Mater. 2008,20 3657-3662.
Mitzi et al., Solar Energy Materials & Solar Cells, vol. 95, pp. 1421-1436, 2011.
Mitzi et al., Nature 428 299-303 (2004).
Schmidt, Hydrazine and Its Derivatives: Preparation, Properties, Applications, John Wiley & Sons, 2nd edn, 2001 (Abstract only).
Todorov et al., Eur. Chem. 2010, 17-28, D01: 10.1002/ejie. 200900837.
Todorov et al., Adv. Mater. 2010, 22, 1-4.
International Search Report issued in PCT Application No. PCT/US2012/042989 dated Dec. 26, 2012.

* cited by examiner

*Primary Examiner* — Khanh Tuan Nguyen
*Assistant Examiner* — Haidung Nguyen
(74) *Attorney, Agent, or Firm* — Venable LLP; Henry J. Daley

(57) ABSTRACT

A solution for forming at least a portion of an active layer of an electronic or electro-optic device includes a solvent, an additive mixed with the solvent to provide a solvent-additive blend, and a solute that includes at least one of a transition metal, an alkali metal, an alkaline earth metal, Al, Ga, In, Ge, Sn, or Sb dissolved in elemental form in the solvent-additive blend. The additive is selected from the group of additives consisting of NR1R2NHCOOH, NH2N—HCONHNH2, NH2COOH.NH3, NH2NHC(=NH)NH2.H2CO3, NH2NHCSNHNH2, NH2NHCSSH and all combinations thereof. R1 and R2 are each independently selected from hydrogen, aryl, methyl, ethyl and a linear, branched or cyclic alkyl of 3-6 carbon atoms. Methods of producing the solution, a method of producing a Kesterite film on a substructure and devices made with the solutions and methods are also provided.

26 Claims, 8 Drawing Sheets

# INORGANIC SOLUTION AND SOLUTION PROCESS FOR ELECTRONIC AND ELECTRO-OPTIC DEVICES

CROSS-REFERENCE OF RELATED APPLICATION

This is a national stage application under 35 U.S.C. §371 of PCT/US2012/042989 filed Jun. 18, 2012, the entire contents of which are incorporated herein by reference and this application claims priority to U.S. Provisional Application No. 61/498,295 filed Jun. 17, 2011, the entire contents of which are hereby incorporated by reference.

BACKGROUND

1. Field of Invention

The field of the currently claimed embodiments of this invention relates to inorganic solutions and solution processes for producing electronic and/or electro-optic devices and devices made by the solutions and processes.

2. Discussion of Related Art

Due to the general concern over global warming, and increasing demand for energy, much research has focused on developing a feasible method for renewable energy generation. Among renewable energy sources, solar energy has attracted the most attention due to the direct conversion of energy to electricity from the sun. However, the scaling up of production and the reduction of cost are still the main issues for photovoltaic technologies to compete with traditionally generated power (Contreras, M. A., Ramanathan, K., AbuShama, J., Hasoon, F., Young, D. L., Egaas, B., & Noufi, R., *Prog. Photovolt: Res. Appl.* 13 209-216 (2005)). Many research efforts have shifted to so-called "second generation" solar cells, which employ compound semiconductors and are based on a single p-n heterojunction (Mitzi, D. B., Kosbar, L. L., Murray, C. E., Copel M., & Afzali, A., *Nature* 428 299-303 (2004)). Due to the suitable band gaps, and high absorption coefficients, $Cu(In,Ga)Se_2$ (CIGS) and its related materials have been the most attractive absorber materials for the fabrication of low-cost, high-efficiency solar cells. However, with rising concerns regarding the supply of the rare metal indium in the mass production stage, low cost, environmental harmless $Cu_2ZnSn(S,Se)_4$ (CZTSSe)-based thin film photovoltaics using earth abundant materials have been expected to provide a potential alternative.

Typically, the absorber layers of thin film solar cells are deposited by either evaporation or sputtering techniques that requires a vacuum environment. Those vacuum-based techniques need to overcome not only complicated processes and non-uniform film composition, but also a large capital investment is required in order to move thin film solar cells into commercialization. Many researchers have focused on reducing production cost through solution-processable active layers. However, most of the attention has been devoted to organic semiconductors. Despite numerous advancements in this area, organic semiconductors still have problems with stability in air. Recently, Mitzi et al. have reported a method for solution processing of inorganic materials with mobilities around 10 $cm^2$ $V^{-1}$ $s^{-1}$, which is comparable to materials produced through traditional processing (Mitzi, D. B., Kosbar, L. L., Murray, C. E., Copel M., & Afzali, A., *Nature* 428 299-303 (2004); Milliron, D. J., Mitzi, D. B., Copel, M. & Murray, C. E., *Chem. Mater.* 18 587-590 (2006); Milliron, D. J., Mitzi, D. B., U.S. Patent Application 0158909 A1 (2005)). However, according to their approach, zinc or zinc chalcogenide cannot be dissolved into their hydrazine solutions. In their process, zinc or zinc chalcogenide constituent suspends as nanoparticles in the precursor solution. Therefore, there remains a need for improved solutions and solution processes for producing electronic and electro-optic devices.

SUMMARY

A solution for forming at least a portion of an active layer of an electronic or electro-optic device according to some embodiments of the current invention includes a solvent, an additive mixed with the solvent to provide a solvent-additive blend, and a solute that includes at least one of a transition metal, an alkali metal, an alkaline earth metal, Al, Ga, In, Ge, Sn, or Sb dissolved in elemental form in the solvent-additive blend. The additive is selected from the group of additives consisting of $NR_1R_2NHCOOH$, $NH_2NHCONHNH_2$, $NH_2COOH.NH_3$, $NH_2NHC(=NH)NH_2.H_2CO_3$, $NH_2NHCSNHNH_2$, $NH_2NHCSSH$ and all combinations thereof. $R_1$ and $R_2$ are each independently selected from hydrogen, aryl, methyl, ethyl and a linear, branched or cyclic alkyl of 3-6 carbon atoms.

A method of producing a solution for forming at least a portion of an active layer of an electronic or electro-optic device according to some embodiments of the current invention includes providing a solvent, mixing an additive with the solvent to provide a solvent-additive blend, and dissolving at least one of a transition metal, an alkali metal, an alkaline earth metal, Al, Ga, In, Ge, Sn, or Sb in elemental form in the solvent-additive blend. The additive is selected from the group of additives consisting of $NR_1R_2NHCOOH$, $NH_2NHCONHNH_2$, $NH_2COOH.NH_3$, $NH_2NHC(=NH)NH_2.H_2CO_3$, $NH_2NHCSNHNH_2$, $NH_2NHCSSH$ and all combinations thereof. $R_1$ and $R_2$ are each independently selected from hydrogen, aryl, methyl, ethyl and a linear, branched or cyclic alkyl of 3-6 carbon atoms.

A method of producing a Kesterite film on a substructure according to some embodiments of the current invention includes obtaining a solution comprising Cu, Zn, Sn and one of S and Se dissolved in a solvent, depositing a layer of the solution on a substructure, and heating the layer of the solution such that the layer forms the Kesterite film.

BRIEF DESCRIPTION OF THE DRAWINGS

Further objectives and advantages will become apparent from a consideration of the description, drawings, and examples.

FIG. 3A shows (a) survey scan on the film. Main peaks of Cu, Zn, Sn, S are marked out; other peaks are electron from other orbits of the four main elements, and absorbed oxygen and carbon. FIG. 3B shows (b) detailed scan of main peak of Zn from CZTS film.

FIG. 6A shows (a) dark J-V characteristics of CZTS device. The insert is a schematic illustration of a CZTS device with the structure of Mo-glass/CZTS (500-800 nm)/CdS (60-80 nm)/ZnO (20-50 nm)/ITO (100 nm). FIG. 6B shows (b) light IV measurement under AM1.5G solar simulator. With an area of 0.12 $cm^2$ determined by mechanical scribing, the device demonstrated a power conversion efficiency of 5.1% after deposit of a layer of $MgF_2$ with the thickness of 150 nm.

DETAILED DESCRIPTION

Figure 1:
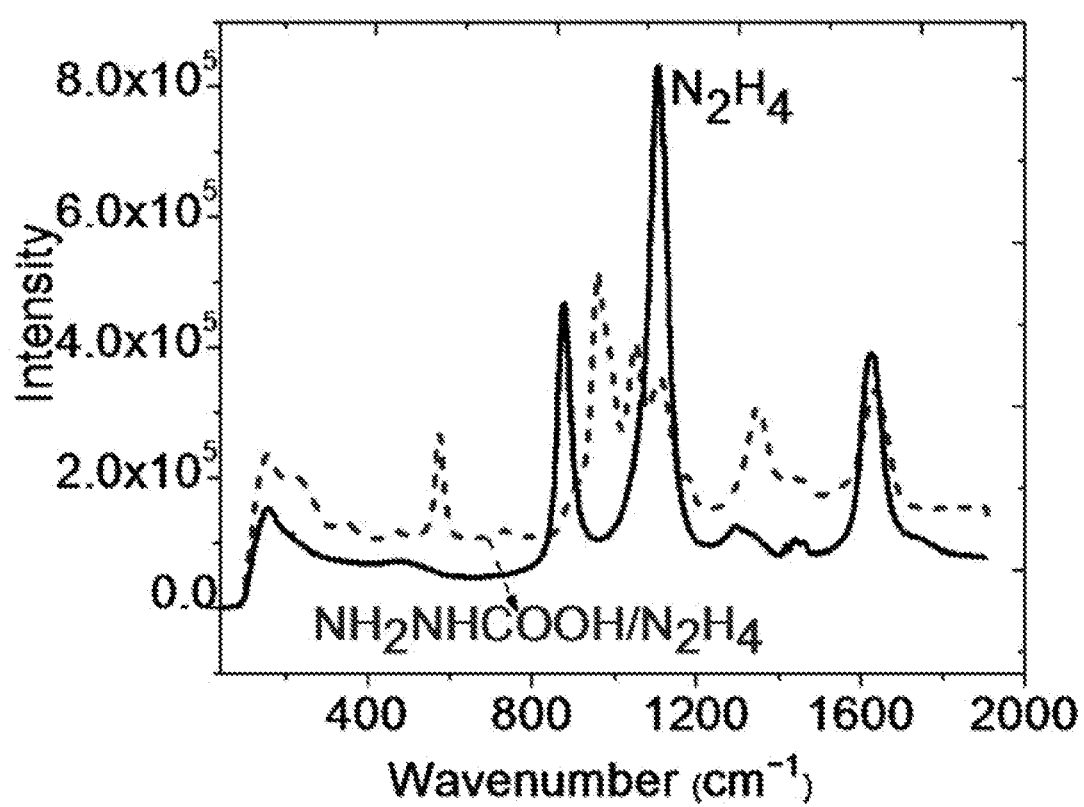
FIG. 1 shows measured Raman spectra of $N_2H_4$ and $NH_2NHCOOH/N_2H_4$ solution systems.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Some embodiments of the current invention can provide a low-cost method for large-scale production of second-generation solar cells, for example. According to an embodiment of the current invention, we use hydrazine to react carbon dioxide to form the desired solvent first and then dissolve desired elemental metals such as copper, zinc, tin and sulfur into the solvent. In effect, the solvent becomes a mixture of the original solvent with an additive in which the elemental materials are dissolved. According to some embodiments of the current invention, a CZTSSe precursor solution that intermixes on a molecular level can be formed. Methods according to some embodiments of the current invention can provide several advantages. First, a uniform active layer can be achieved from the point view of chemical composition distribution. Due to the nature of molecular-level mixing of the solution, both electrical and structural properties of the solar cell active layer can be precisely controlled. Second, we can use elemental metal and pure sulfur and selenium powder as the raw materials, which can reduce the cost even more by eliminating the need for synthesis of a metal chalcogenide.

An embodiment of the current invention is directed to a solution for forming at least a portion of an active layer of an electronic or electro-optic device. The solution includes a solvent, an additive mixed with the solvent to provide a solvent-additive blend, and a solute that includes at least one of a transition metal, an alkali metal, an alkaline earth metal, Al, Ga, In, Ge, Sn, or Sb dissolved in elemental form in the solvent-additive blend. The term "elemental form" is referring to atomic elements in a general sense which can include neutral and ionic forms of the element. In addition, the solvent-additive blend can also be referred to as a solvent. The terms additive and solvent-additive blend are used to avoid confusion. The additive is selected from the group of additives consisting of $NR_1R_2NHCOOH$, $NH_2NHCONHNH_2$, $NH_2COOH.NH_3$, $NH_2NHC(=NH)NH_2.H_2CO_3$, $NH_2NHCSNHNH_2$, $NH_2NHCSSH$ and all combinations thereof, where $R_1$ and $R_2$ are each independently selected from hydrogen, aryl, methyl, ethyl and a linear, branched or cyclic alkyl of 3-6 carbon atoms.

According to an embodiment of the current invention, the solvent can be selected from the group of solvents consisting of $N_2H_4$, $H_2O$, liquid ammonia, methanol, ethanol, acetonitrile and all combinations thereof. In an embodiment, the solvent consists essentially of $N_2H_4$. However, the invention is not limited to only this embodiment. In an embodiment, the solute is a transition metal. For example, the transition metal can be Zn according to one embodiment.

According to an embodiment of the current invention, the additive can be $NR_1R_2NHCOOH$. In an embodiment, $R_1$ and $R_2$ can both be hydrogen, H, for example. In an embodiment, the transition metal can be Zn and the additive can be $NH_2NHCOOH$, for example. The solvent in this example can further include $N_2H_4$.

In some embodiments, the solute can further include a chalcogen. For example, the chalcogen can be, but is not limited to, at least one of S or Se. In some embodiments, the solute can include Cu, Zn, Sn, and at least one of S or Se, for example. In some embodiments, the solute can consist essentially of Cu, Zn, Sn, and at least one of S or Se.

An embodiment of the current invention is directed to a method of producing a solution for forming at least a portion of an active layer of an electronic or electro-optic device. The method includes providing a solvent, mixing an additive with the solvent to provide a solvent-additive blend, and dissolving at least one of a transition metal, an alkali metal, an alkaline earth metal, Al, Ga, In, Ge, Sn, or Sb in elemental form in the solvent-additive blend. The term "mixing an additive with" is intended to have a broad meaning which can include adding the solvent from an external supply as well as adding material that reacts chemically with the solvent to provide an additive mixed with the solvent. The additive is selected from the group of additives consisting of $NR_1R_2NHCOOH$, $NH_2NHCONHNH_2$, $NH_2COOH.NH_3$, $NH_2NHC(=NH)NH_2.H_2CO_3$, $NH_2NHCSNHNH_2$, $NH_2NHCSSH$ and all combinations thereof, where $R_1$ and $R_2$ are each independently selected from hydrogen, aryl, methyl, ethyl and a linear, branched or cyclic alkyl of 3-6 carbon atoms.

In some embodiments, the solvent is selected from the group of solvents consisting of $N_2H_4$, $H_2O$, liquid ammonia, methanol, ethanol, acetonitrile and all combinations thereof. Methods according to some embodiments can produce solutions for any of the solutions mentioned above. Methods according to some embodiments of the current invention can also include producing the additive by mixing $N_2H_4$ with $CO_2$. For example, $N_2H_4$ can be mixed with solid $CO_2$ as is described in more detail for a particular example below. Methods according to some embodiments of the current invention can also include producing a second solution that includes a chalcogen dissolved in a second solvent, and then mixing the second solution with the first-mentioned solution. In some embodiments, the producing the second solution can also include dissolving a metal chalcogenide in the second solvent. Other components can be included in the second solution, and/or a third solution can be produced in a similar way to add additional components to the combined solution. The invention is not limited to only second and third solutions, but can include addition solutions, if desired, for the particular application.

An embodiment of the current invention is directed to a method of producing a Kesterite film on a substructure. The method according to this embodiment includes obtaining a solution that includes Cu, Zn, Sn and one of S and Se dissolved in a solvent, depositing a layer of the solution on a substructure, and heating the layer of the solution such that the layer forms the Kesterite film. The solution and/or method of producing the solution can be based on embodiments of the current invention noted above as well as some particular examples described below, for example. The Kesterite film and the substructure can be at least a portion an electronic or electro-optic device. The electronic or electro-optic device can be, but is not limited to, a photovoltaic device, for example. Some embodiments of the current invention are also directed to an electronic or electro-optic device that includes a Kesterite film on a substructure produced according methods and/or using solutions according to embodiments of the current invention.

EXAMPLES

The following examples help explain some concepts of the current invention. However, the general concepts of the current invention are not limited to the particular examples.

Procedures:

Precursor Solution Preparation and Characterization

The mixture of hydrazine and hydrazine carboxylic acid is used as a solvent in this example. Hydrazine carboxylic acid is prepared by adding hydrazine into solid state carbon dioxide in a nitrogen filled dry box where oxygen and moisture levels are both below 0.1 ppm. The viscosity of the mixture liquid increases with the amount of carbon dioxide added. The desired precursor viscosity can be achieved by changing the ratio between hydrazine and hydrazine carboxylic acid. This can be an important advantage, especially for large-area device fabrication. The products of carbon dioxide and hydrazine were investigated by Raman spectroscopy.

Note: The reaction between carbon dioxide and hydrazine is highly exothermal, with a large amount of carbon dioxide sublimation out of the container.

Zinc Precursor

Zinc nanoparticle (99.9%, 30-50 nm, MTI Corporation) was chosen as the raw material due to the large surface area which can increase the reaction and dissolution process rate. Three mmol zinc nanoparticles was first placed into a glass vial and the mixture of hydrazine carboxylic acid and hydrazine was then added into the vial. Moderate reaction was observed with continuous fine bubbles generated in the solution. Zinc precursor solution system was then left stirring on a stirring plate. To disperse the aggregation of zinc or zinc compounds uniformly into solution system, ultrasonic treatment was used for the solution system. At the end, a viscous paste of zinc precursor was obtained.

Copper and Tin Precursor

A precursor containing copper and a precursor containing tin were prepared in the dry box separately. One mmol of elemental copper (Cu, 325 mesh, 99.99%) and two mmol of sulfur (S, 99.95%) were combined with 1 mL of hydrazine ($N_2H_4$). The mixture was left stirring. A clear pale yellow solution was obtained only after several hours, which took less time than that prepared from $Cu_2S$ powder. Similarly, the tin precursor solution was prepared in a separate vessel, by mixing and stirring one mmol of tin powder (Sn, 325 mesh, 99.99%) and 4 mmol excess sulfur (99.998%).

CZTSSe Precursor

The zinc paste, tin and copper precursor solutions were mixed under a targeted ratio, Zn/Sn=1.2 and Cu/(Zn+Sn)=0.8, to obtain the CZTSSe precursor solution. First, the tin precursor solution was added into the zinc paste, followed by continuous stirring. The mixed solution gradually turned into a transparent solution while bubbling with moderate reaction, while the color of the solution evolved from clear to yellow to reddish brown with increased extra sulfur incorporated into the solution. The transparent CZST precursor preparation can be completed by adding the Cu precursor solution into the clear Zn/Sn solution with the ratio described above.

CZTSSe Film Characterization

CZTSSe thin films from the precursor were characterized by X-ray diffraction, Raman, x-ray photoelectron spectroscopy (XPS) for structure, phase and composition analysis. XRD powder samples were prepared by annealing the precursor solution at 140° C. first to evaporate solvent, followed by a final heat treatment at 550° C. for 30 minutes under inert gas atmosphere of Ar. XRD patterns were collected on a PANalytical X'Pert Pro X-ray Powder Diffractometer using Cu—K$\alpha$ radiation ($\lambda$=1.54060 Å).

For XPS and Raman analysis, films were deposited via spin coating on Mo (1 μm) coated glass, which was treated by $Ar/O_2$ plasma prior to the solution deposition. The cast film was first subjected to an intermediate annealing between 110 to 300° C., followed by a heat treatment under an inert atmosphere at 390° C. for 30 mins. The XPS measurements were performed by an Omicron XPS/UPS system, where the base pressure is lower than $10^{-9}$ mbar in the analysis chamber of the system. A monochromatic Al K$\alpha$ (1486.6 eV) X-ray source was used for excitation and the spectra were collected with a pass energy of 50 eV. Raman analysis was carried out on the system of Renishaw in Via Raman Microscope using excitation laser with wavelength of 514 nm.

Photovoltaic Device Fabrication and Measurement

Devices were fabricated with the structure of Mo/CZTSSe/CdS/ZnO/ITO. First, one layer of CZTSSe film was deposited via spin coating (rpm=3000, 50 seconds). The film was subjected to an intermediate annealing on a hot plate between 150-300° C. for 10 mins. The procedure was repeated several times until a certain thickness was achieved and then the entire file was subjected to a final heat treatment at 500° C. with sulfur vapor. The n-type material, cadmium sulfide was deposited via a chemical bath deposition. Intrinsic ZnO and ITO was deposited using RF-sputter with Ar flow as the top transparent electrode (w. W. Hou, B. Bob, S.-h. Li, and Y. Yang, Thin Solid Films, 517 6853-6856, 2009). The current versus voltage (I-V) performance was measured under an AM1.5G filter at 100 mW/cm$^2$ using a Newport Oriel 92192 solar simulator.

Results and Discussion

Solution Preparation

The reaction of hydrazine with carbon dioxide produces a viscous solution system of $NH_2NHCOOH$ coexisting with hydrazine. It leads to precipitation of $NH_2NHCOOH$ with introduction of excess carbon dioxide into the solution system.

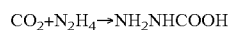

(E. W. Schmidt, *Hydrazine and Its Derivatives: Preparation, Properties, Applications*, John Wiley & Sons, 2nd edn, 2001).

FIG. 1 shows spectra from Raman spectroscopy of a saturated solution of $NH_2NHCOOH$ in hydrazine. In the Raman spectrum of hydrazine, solid curve, the frequency peak at 1628 cm$^{-1}$ relates to NH$_2$ deformation, 1295 cm$^{-1}$ NH$_2$ wagging, 1111 cm$^{-1}$ N—N stretching and 882 cm$^{-1}$ NH$_2$ rocking respectively (E. W. Schmidt, *Hydrazine and Its Derivatives: Preparation, Properties, Applications*, John Wiley & Sons, 2nd edn, 2001). Compared to hydrazine, the 1350 cm$^{-1}$ band of the NH$_2$NHCOOH Raman spectrum is attributed to COO symmetric mode (Adolf Jesiha, Anka Rahtena, Primoz Benkica, Tomaz Skapina, Ljupco Pejovb, Vladimir M. Petrusevski, Journal of Solid State Chemistry, 177 4482-4493 (2004)). The two extra blue-shifted peaks about N—N stretching in solution system of NH$_2$NHCOOH/N$_2$H$_4$ could be observed; 963 cm$^{-1}$ is according to N—N stretching in NH$_2$NH$_3$$^+$; 1050 cm$^{-1}$ is due to the shorter N—N distance in hydrazine carboxylic acid. The peak around 570 cm$^{-1}$ is also a vibration frequency mode belonging to the molecular NH$_2$NHCOOH.

Using the NH$_2$NHCOOH solution system can simplify fabrication processes for solar cell absorption layers. Compared with pure hydrazine solvent, the mixture solution system shows larger viscosity. The increase of viscosity in NH$_2$NHCOOH solution is, at least partially, due to cross-linked networks of hydrogen bond H . . . OH introduced by —OH. The less viscous property in pure N$_2$H$_4$ results from the weaker H bonding and the fact that each —NH$_2$ group has only 1 lone-pair of electrons compared with 2 for each —OH group. Due to the low viscosity of hydrazine solution systems, multiple deposition usually needs to be done in order to achieve the required thickness for solution processed photovoltaic device applications (e.g. CIGS, CZTSSe) (Mitzi D., Yuan M., Liu W., Kellock A., Chey S., Deline V., Schrott A., Adv. Mater. 2008, 20 3657-3662; Todorov T., Reuter K., Mitzi D., Adv. Mater. 2010, 22, 1-4). For a larger viscosity solution, a thicker film can be obtained under the same deposition conditions. This can be important for the solution process, since it can reduce number of films that have to be cast to fabricate an absorption layer.

Figure 2:
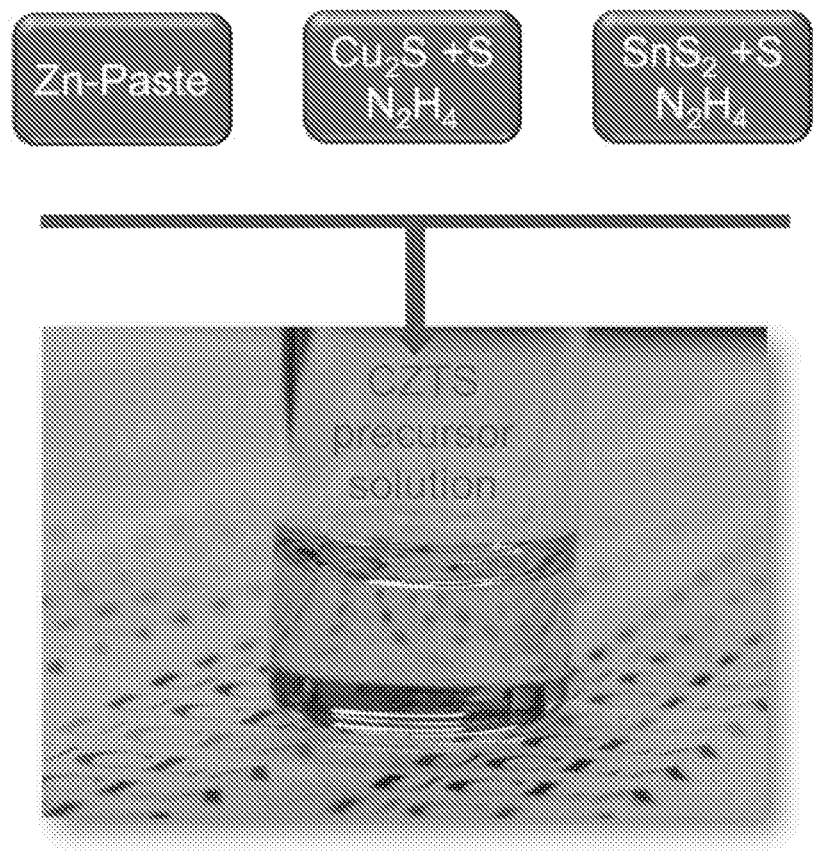
FIG. 2 shows a CZTS precursor solution. Zn-paste dissolves to form a clear Zn/Sn solution system after adding Sn-precursor into Zn-paste in $NH_2NHCOOH/N_2H_4$. Final CZTS precursor solution is completed after adding Cu-precursor into Zn/Sn solution system. Target compositional ratio inside of the solution system is Zn/Sn=1.2, Cu/(Zn+Sn)=0.8.

For solution processing inorganic thin films, in many respects, hydrazine can be an ideal solvent, since it is a strong reducing agent and can therefore stabilize the formation of metal chalcogenide anions in solution. The hydrazine molecule is small and volatile and also tends not to coordinate strongly (Todorov T., Mitzi D., *Eur. J. Inorg. Chem.* 2010, 17-28, DOI: 10.1002/ejic.200900837). However, solution processing via hydrazine can be limited by the solubility of many materials of interest (e.g., ZnSe$_{1-x}$S$_x$ in hydrazine solvents, relevant for the deposition of Cu$_2$ZnSnS$_4$ or Cu$_2$ZnSnSe$_4$) (Todorov T., Reuter K., Mitzi D., Adv. Mater. 2010, 22, 1-4). In this approach, we first mix Zn powder with NH$_2$NHCOOH/N$_2$H$_4$ solution, in which moderate reaction is observed with continuous bubbling. Keeping the system stirring for several days, a gray paste was obtained after the reaction. Adding SnS$_2$ solution into Zn-precursor paste toward the target ratio of Zn/Sn=1.2, it turns into a clear solution. The final precursor CZTSSe solution is shown in FIG. 2 by mixing Cu-precursor solution with Zn/Sn solution system to the target ratio of Zn/Sn=1.2, Cu/(Zn+Sn)=0.8.

CZTSSe Film Characterization

Figure 3A:
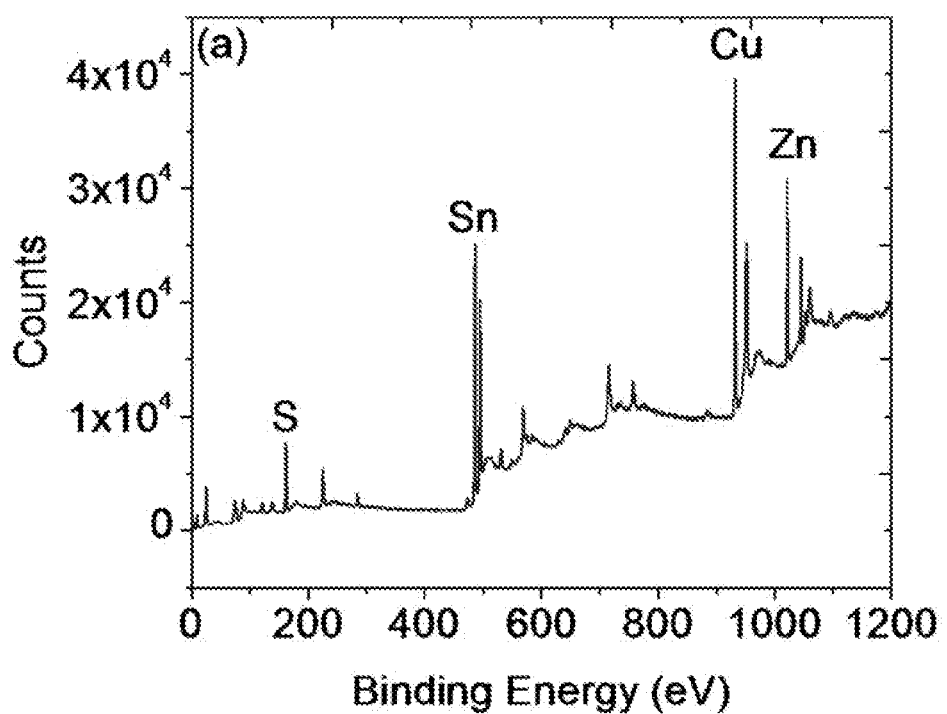
FIGS. 3A and 3B show XPS results on CZTS film deposited and annealed from solution method.
Figure 3B:
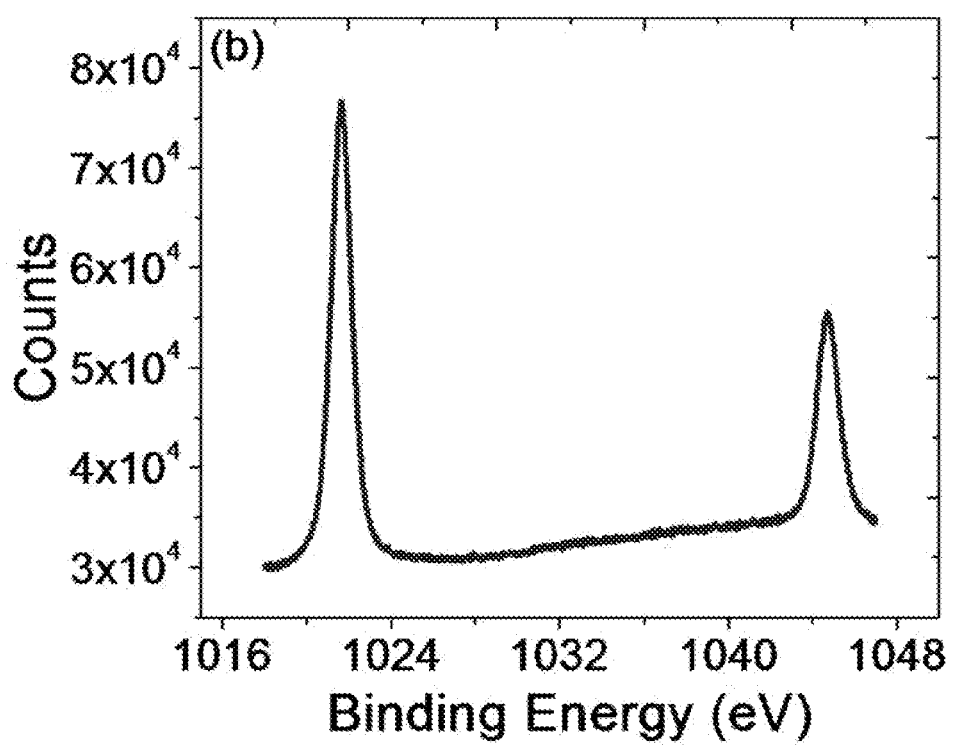

X-ray photoelectron spectroscopy (XPS) results (FIGS. 3A and 3B) show the main peak of Cu (932 eV, 952 eV), Zn (1022 eV, 1045 eV), Sn (486 eV, 494 eV) and S (161 eV). Furthermore, from the XPS spectrum, Zn$^0$ status could not be observed in the final film, indicating the conversion of metallic Zn$^0$ into Zn$^{2+}$ during the solution deposited process.

Figure 4:
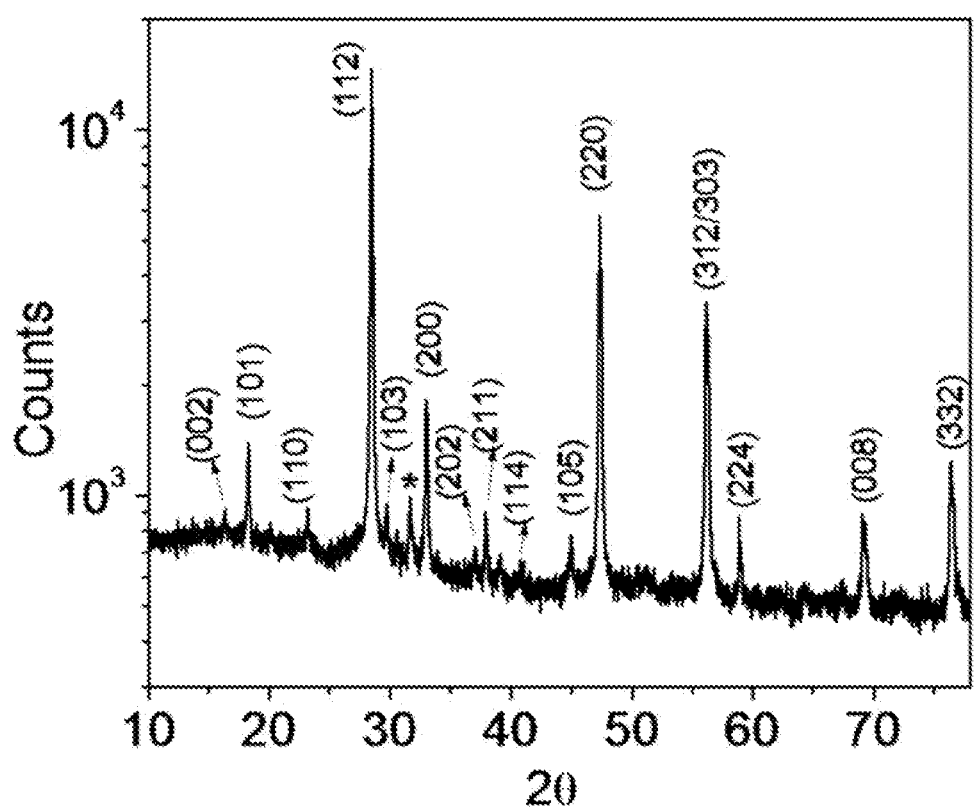
FIG. 4 shows a powder X-ray diffraction pattern of CZTS (JCPDS 26-0575) annealed at 550° C. in an inert atmosphere. The peak marked between (103) and (200) is identified as $Cu_2S$, which could be avoided by optimizing the precursor solution to a relative Cu-poor condition.

Highly crystalline Kesterite CZTSSe is achieved from mixture solution via heat treatment at 550° C. for 30 mins. In FIG. 4, the XRD pattern indicates the crystalline phase of CZTS (JCPDS 26-0575), without any further sulfurlization or selenization process after annealing process. It shows a potential for high performance CZTSSe solar cells. The crystalline phase of CZTS could also be obtained at the annealing condition as low as 390° C. in an inert atmosphere. It suggests that the synthesis route of CZTS from this solution process is different from that of solid state metal or metal chalcogenides reaction (Katagiri H., Jimbo K., Maw W., Oishi K., Yamazaki M., Araki H., Takeuchi A., Thin Solid Films, 517 (2009) 2455-2460). Other than diffraction peaks of CZTS, however, an impurity peak of Cu$_2$S shows up (marked as asteroid) in FIG. 4. With further work on compositional adjustment in precursor solution, the formation of Cu$_2$S phase could be prevented from a relatively Cu-poor precursor solution.

Figure 5:
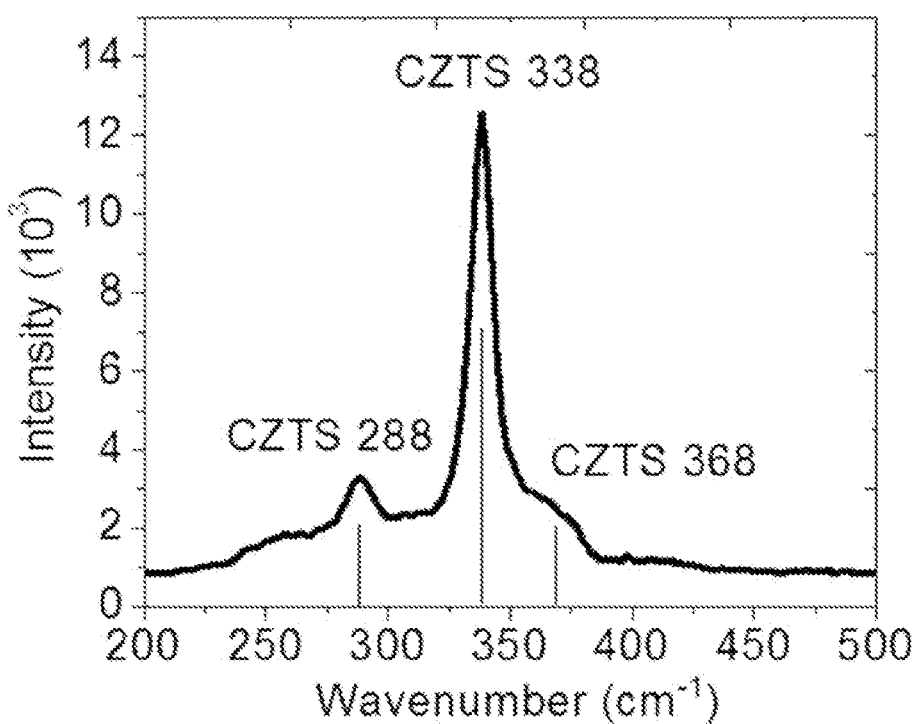
FIG. 5 shows Raman spectra of CZTS film subjected to heat treatment deposited from as-prepared precursor solution described above, indicating the formation of Kesterite phase with the characteristic peaks at 288 $cm^{-1}$, 338 $cm^{-1}$ and 368 $cm^{-1}$.

FIG. 5 shows a Raman spectrum from the CZTS layer at 550° C. Peaks corresponding to the CZTS compound were observed at 288, 338 and 368 cm$^{-1}$, which shows comparable results with published Raman data for CZTS (Altosaar M., Raudoja J., Timmo K., Danilson M., Grossberg M., Krustok J., Mellikov E., Phys. Status Solidi A, 205 167, (2008)). The appearance of the CZTS phase in Raman spectroscopy was also consistent with the results of XRD measurement.

CZTS Photovoltaic Device

Figure 6A:
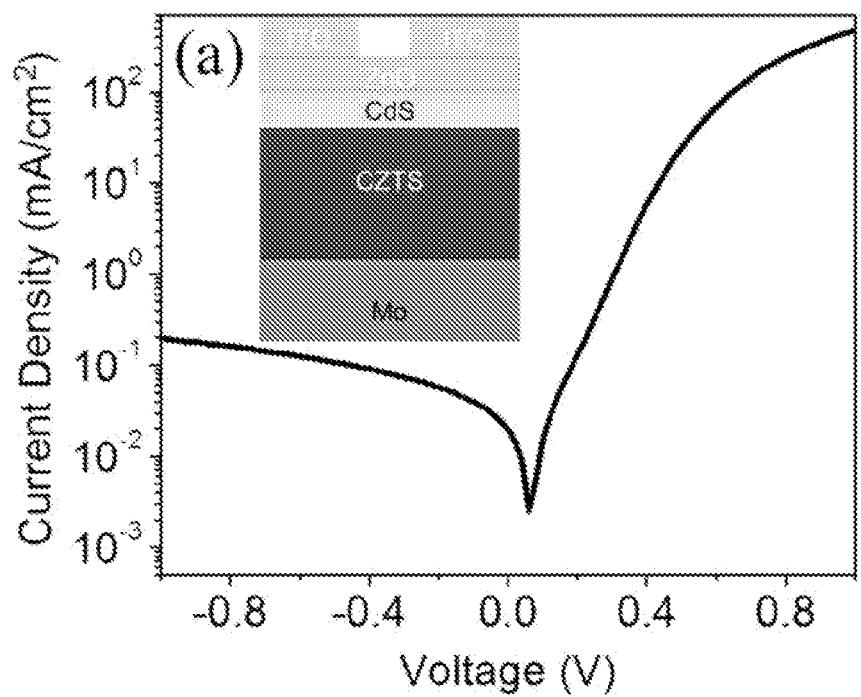
FIGS. 6A and 6B show I-V characterization of as-prepared CZTSSe photovoltaic device according to an embodiment of the current invention.
Figure 6B:
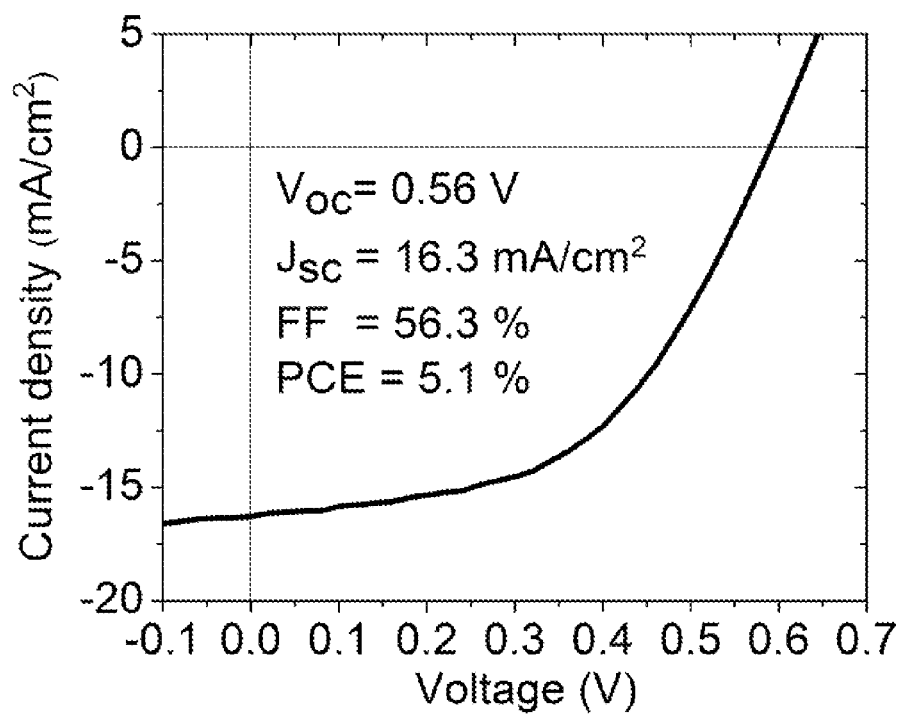

A CZTS device was demonstrated with a structure of Mo-glass/CZTS (500-800 nm)/CdS (60-80 nm)/ZnO (20-50 nm)/ITO (100 nm). It shows the IV characteristics of a CZTSSe device in FIGS. 6A and 6B. The dark IV curve indicates the rectifying effect between the p-n junction of CZTS/CdS. Under AM1.5G condition, the light IV characterization yields short circuit current (J$_{sc}$), open circuit voltage (V$_{oc}$), fill factor (FF), power conversion efficiency as 16.3 mA/cm$^2$, 0.56 V, 56.3%, 5.1% respectively with a post deposited anti-reflecting layer of MgF$_2$ (150 nm). The main limiting factor in devices lies in the photocurrent, which might be caused by incomplete absorption of CZTS film (500-1000 nm) and carrier recombination at grain boundaries. With future optimization on the absorber layer including thickness, composition and morphology, we believe that Kesterite CZTS solar cells can provide a significant improvement in the field of photovoltaic device design and module applications.

CONCLUSION

Methods described according to some embodiments of this invention demonstrated: 1) a dissolution process of transition metal Zn into NH$_2$NHCOOH solution system, 2) a solution-based synthesis route of Kesterite CZTS for solar cell application. The method can provide an opportunity for solution processing of materials of interest, for instance, Zn, ZnS, but with limited solubility in other solution system (e.g. N$_2$H$_4$). Second, the solution based synthesis route demonstrated here introduces a simple approach to control the composition and uniformity via homogeneous CZTSSe precursor solution. This specific solution processing method can provide a powerful tool to deposit a uniform film in chemical composition for large scale device/module fabrication, for example.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A solution for forming at least a portion of an active layer of an electronic or electro-optic device, comprising:
    a solvent;
    an additive mixed with said solvent to provide a solvent-additive blend; and
    a solute comprising at least one of a transition metal, an alkali metal, an alkaline earth metal, Al, Ga, In, Ge, Sn, or Sb dissolved in elemental form in said solvent-additive blend,
    wherein said additive is selected from the group of additives consisting of $NR_1R_2NHCOOH$, $NH_2NHCONHNH_2$, $NH_2COOH \cdot NH_3$, $NH_2NHC(\!\!=\!\!NH)NH_2\!\!-\!\!H_2CO_3$, $NH_2NHCSNHNH_2$, $NH_2NHCSSH$ and all combinations thereof,
    wherein $R_1$ and $R_2$ are each independently selected from hydrogen, aryl, methyl, ethyl and a linear, branched or cyclic alkyl of 3-6 carbon atoms, and
    wherein said solute comprises Cu, Zn, Sn, and at least one of S or Se.

2. A solution according to claim 1, wherein said solvent is selected from the group of solvents consisting of $N_2H_4$, $H_2O$, liquid ammonia, methanol, ethanol, acetonitrile and all combinations thereof.

3. A solution according to claim 1, wherein said solvent consists essentially of $N_2H_4$.

4. A solution according to claim 1, wherein said additive is $NR_1R_2NHCOOH$.

5. A solution according to claim 4, wherein $R_1$ and $R_2$ are both H.

6. A solution according to claim 1, wherein said solute consists essentially of Cu, Zn, Sn, and at least one of S or Se.

7. A solution for forming at least a portion of an active layer of an electronic or electro-optic device, comprising:
    a solvent;
    an additive mixed with said solvent to provide a solvent-additive blend; and
    a solute comprising a transition metal dissolved in elemental form in said solvent-additive blend,
    wherein said solute is said transition metal,
    wherein said transition metal is Zn, and
    wherein said additive is $NH_2NHCOOH$.

8. A solution according to claim 7, wherein said solvent comprises $N_2H_4$.

9. A solution for forming at least a portion of an active layer of an electronic or electro-optic device, comprising:
    a solvent;
    an additive mixed with said solvent to provide a solvent-additive blend; and
    a solute comprising at least one of a transition metal, an alkali metal, an alkaline earth metal, Al, Ga, In, Ge, Sn, or Sb dissolved in elemental form in said solvent-additive blend,
    wherein said additive is selected from the group of additives consisting of $NR_1R_2NHCOOH$, $NH_2NHCONHNH_2$, $NH_2COOH \cdot NH_3$, $NH_2NHC(\!\!=\!\!NH)NH_2 \cdot H_2CO_3$, $NH_2NHCSNHNH_2$, $NH_2NHCSSH$ and all combinations thereof,
    wherein $R_1$ and $R_2$ are each independently selected from hydrogen, aryl, methyl, ethyl and a linear, branched or cyclic alkyl of 3-6 carbon atoms, and
    wherein said solute further comprises Se.

10. A solution according to claim 9, wherein said solute is said transition metal.

11. A solution according to claim 10, wherein said transition metal is Zn.

12. A method of producing a solution for forming at least a portion of an active layer of an electronic or electro-optic device, comprising:
    providing a solvent;
    mixing an additive with said solvent to provide a solvent-additive blend; and
    dissolving at least one of a transition metal, an alkali metal, an alkaline earth metal, Al, Ga, In, Ge, Sn, or Sb solute in elemental form in said solvent-additive blend,
    wherein said additive is selected from the group of additives consisting of $NR_1R_2NHCOOH$, $NH_2NHCONHNH_2$, $NH_2COOH \cdot NH_3$, $NH_2NHC(\!\!=\!\!NH)NH_2 \cdot H_2CO_3$, $NH_2NHCSNHNH_2$, $NH_2NHCSSH$ and all combinations thereof,
    wherein $R_1$ and $R_2$ are each independently selected from hydrogen, aryl, methyl, ethyl and a linear, branched or cyclic alkyl of 3-6 carbon atoms, and
    wherein said solute comprises Cu, Zn, Sn, and at least one of S or Se.

13. A method according to claim 12, wherein said solvent is selected from the group of solvents consisting of $N_2H_4$, $H_2O$, liquid ammonia, methanol, ethanol, acetonitrile and all combinations thereof.

14. A method according to claim 12, wherein said solvent consists essentially of $N_2H_4$.

15. A method according to claim 12, wherein said dissolving is dissolving said transition metal in said solvent-additive blend.

16. A method according to claim 15, wherein said transition metal is Zn.

17. A method according to claim 16, wherein said additive is $NH_2NHCOOH$.

18. A method according to claim 17, further comprising producing said additive by mixing $N_2H_4$ with $CO_2$.

19. A method according to claim 18, wherein said solvent comprises $N_2H_4$.

20. A method according to claim 12, wherein said additive is $NR_1R_2NHCOOH$.

21. A method according to claim 20, wherein $R_1$ and $R_2$ are both H.

22. A method according to claim 12, further comprising:
    producing a second solution comprising a chalcogen dissolved in a second solvent; and
    mixing said second solution with said first-mentioned solution.

23. A method according to claim 22, wherein said producing said second solution comprises dissolving a metal chalcogenide in said second solvent.

24. A method according to claim 23, wherein said metal chalcogenide comprises at least one of the metals Cu and Sn and at least one of the chalcogens S and Se.

25. A method according to claim 22, wherein said second solvent is the same solvent as said first-mentioned solvent.

26. A method according to claim 22, wherein said chalcogen is at least one of S or Se.

* * * * *